US005892682A

United States Patent [19]
Hasley et al.

[11] Patent Number: 5,892,682
[45] Date of Patent: Apr. 6, 1999

[54] METHOD AND APPARATUS FOR GENERATING A HIERARCHICAL INTERCONNECTION DESCRIPTION OF AN INTEGRATED CIRCUIT DESIGN AND USING THE DESCRIPTION TO EDIT THE INTEGRATED CIRCUIT DESIGN

[75] Inventors: Lloyd Hasley; Chris Hall, both of Austin, Tex.

[73] Assignee: Motorola, Inc., Schaumburg, Ill.

[21] Appl. No.: 669,123

[22] Filed: Jun. 17, 1996

[51] Int. Cl.⁶ .............................. G06F 17/50; G06F 17/00
[52] U.S. Cl. .......................... 364/488; 364/489; 364/490
[58] Field of Search ................................... 364/488–491, 364/578; 395/500

[56] References Cited

U.S. PATENT DOCUMENTS

| 5,218,551 | 6/1993 | Aggrawal et al. ........................ 364/491 |
| 5,301,318 | 4/1994 | Mittal ....................................... 395/701 |
| 5,555,201 | 9/1996 | Dangelo et al. ........................... 364/489 |

OTHER PUBLICATIONS

Choi et al "Extracting and Restructuring the Design of Large Systems," IEEE, pp. 66–71, Jan. 1990.
Gupta et al "M1: A Small Computer System Synthesis Tool," IEEE, pp. 230–236, May 1990.
Karam et al "Design and Analysis of a Class of Hierarchical Interconnection Networks," IEEE, pp. 369–373, Oct. 1990.
Asser N. Tantawi "Performance of Hierarchically Interconnected Muliprocessor," IEEE, pp. 352–359, Jun. 1990.
Wei et al. "Efficient Hierarchical Interconnection for Multiprocessor Systems," IEEE, pp. 709–717, Nov. 1992.
Kumar et al "Extended Hypercube: A Hierarchical Interconnection Network of Hypercubes," IEEE, pp. 45–57, Jan. 1992.

Primary Examiner—Kevin J. Teska
Assistant Examiner—Vuthe Siek
Attorney, Agent, or Firm—Keith E. Witek

[57] ABSTRACT

Data processing system (800) and process (100) produce a hierarchical interconnection description of an integrated circuit design from a plurality of functional modules and a desired hierarchy. After an integrated circuit description is received (102), an interconnection structure is created (104) for each hierarchical level and functional module within the integrated circuit description. Based upon the desired hierarchy, a hierarchical tree is generated. Based upon the hierarchical tree, the interconnection structures are filled (106) with relevant interconnection and pin information to define interconnections among functional modules and hierarchical levels. After each interconnection structure is filled, a complete hierarchical interconnection description of the integrated circuit design has been completed. Finally, the hierarchical interconnection description is output (108). The present invention also includes generating a higher functional level description of an integrated circuit from a lower functional level description (300). Further included is a technique for generating integrated circuits based upon the present invention.

32 Claims, 7 Drawing Sheets

| PINS: | MODULES: | | | | | | |
|---|---|---|---|---|---|---|---|
| | A | B | C | L1 | L2 | L3 | L4 |
| CLK | O | O | – | O | – | I | – |
| ACK | B | B | – | I | O | – | – |
| TENA | O | – | O | – | – | – | O |
| RENA | O | – | O | – | – | – | O |
| RESET | O | I | O | I | – | – | O |
| ENABLE | – | – | – | – | I | – | – |
| CLK_ENA | – | – | – | – | – | I | – |

SIGNAL CROSS REFERENCE LIST
(I-IN O-OUT B-I/O)

METHOD AND APPARATUS FOR GENERATING A HIERARCHICAL INTERCONNECTION DESCRIPTION OF AN INTEGRATED CIRCUIT DESIGN AND USING THE DESCRIPTION TO EDIT THE INTEGRATED CIRCUIT DESIGN

TECHNICAL FIELD OF INVENTION

This invention relates generally to the design and manufacture of integrated circuitry and more particularly to a method and associated apparatus for generating a hierarchical interconnection description of an integrated circuit design, for using the hierarchical interconnection description to create and alter integrated circuit designs, and for converting integrated circuit designs from one functional level to another functional level using the hierarchical interconnection description.

BACKGROUND OF THE INVENTION

In a typical process employed in the design of a modern integrated circuit, designers first specify an overall operation to be achieved by an integrated circuit. The specified operation is defined at a high level of abstraction and generally describes a desired set of operations to be performed by of the integrated circuit. Once specified, the overall operation of the integrated is then successively broken into components and sub-components with each component or sub-component performing a specific operation or set of operations. After the overall operation has been broken down into its lowest level of operational components and/or sub-components, a model of the integrated circuit design is then constructed by assembling and interconnecting functional modules, each of which possesses a low level of functionality. These functional modules, otherwise known as leaf modules, are defined for the integrated circuit design and perform functions such as arithmetic functions, AND functions, OR functions, and various other functions. The leaf modules typically are defined by inputs, outputs, and logical relationships between inputs and outputs and correspond to particular implementations of gates or cells in an actual integrated circuit. After the functional modules are assembled and interconnected to complete the behavioral level model, the leaf modules operating in combination perform the previously specified operation of the integrated circuit design.

The assembled leaf modules and their interconnections provides a behavioral level model of an integrated circuit. The behavioral level model is then used to construct a register transfer level (RTL), a next lower functional level model of the integrated circuit design. The RTL model of the integrated circuit design may then be used to construct a gate level model, a next lower functional level, and then a component level model of the integrated circuit design, still a lower functional level model. The component level model may then be employed to create a physical design file that represents a physical model of the integrated circuit. The physical design file may then be used to generate mask sets used in the manufacture of the integrated circuit design to create a working integrated circuit. Thus, by successively converting the behavioral model of the integrated circuit design to lower and lower functional level, the behavioral model may be used to produce a working integrated circuit.

The creation of behavioral level models is a difficult and tedious process. In typical prior art technique for creating a behavioral level model, leaf modules were manually selected, assembled, and interconnected. Because the manual process was overwhelming, the task was often broken into parts wherein implementations of differing operational segments of the overall integrated circuit design were accomplished by different design groups. Once behavioral models were created for each segment, the separate segments were joined into a complete behavioral model by defining interconnections between the functional modules of differing segments of the integrated circuit design. Once assembled, the interconnected segments became a behavioral model of the complete integrated circuit design. The manual process, of course, was prone to error due to the size and complexity of the task. Further, because different design groups worked semi-independently, the segregation of efforts also introduced errors into the behavioral level model.

One particular difficulty arising through the manual assembly and interconnection process related to naming conventions. In almost all integrated circuit designs, some leaf module are used many times. However, because each of the leaf modules had inputs and outputs with common names, difficulties often arose because of duplicate naming problems. Further, when editing the behavioral level model after compilation, edits to inputs and outputs of particular leaf modules having common names could not easily be performed.

Difficulties also often arose in the common naming of differing interconnections within the behavioral level model. These difficulties were most pronounced when separate groups constructed different portions of a behavioral level model. When the behavioral level model included commonly named interconnections that were operationally distinct, the interconnections could be inadvertently connected in a lower functional level implementation of the integrated circuit design based upon the behavioral level model.

Errors in the design of integrated circuits, such as those introduced in assembling and interconnecting leaf modules, are difficult to detect and often are present in the integrated circuits created using the design. Fixing these errors in the actual integrated circuit introduces additional costs and delays. Thus, it is extremely important to reduce or alleviate errors in the design at the time the design is completed.

In many situations, it is desirable to take a proven existing design, to segregate the existing design into a number of functional subparts, to modify the design by adding, removing, or altering functional subparts, and to manufacture other integrated circuits based upon the altered design. Typically, in the reuse of designs, an integrated circuit has been manufactured and completely debugged and has an accurate representation at a component level or gate level, the gate level model being one functional level above the component level and one functional level below the register transfer level. However, it is difficult or impossible to significantly alter a component level or gate level representation of an integrated circuit. Alterations of this scope may only be easily performed within a behavioral level model. Therefore, without a debugged behavioral level model based upon an existing design to modify, it is difficult to reuse and significantly alter a debugged and proven design to create other designs.

Thus there is a need in the art for a technique and system that creates a hierarchical interconnection description of an integrated circuit design, that uses the hierarchical interconnection description in the modification of designs, and that uses the hierarchical interconnection description to translate designs from a lower functional level to a higher functional level.

DETAILED DESCRIPTION OF THE DRAWINGS

The present invention teaches a method and associated structure for generating a hierarchical interconnection description for at least a portion of an integrated circuit design, for converting an integrated circuit design from a lower functional level to a higher functional level, and for manufacturing an integrated circuit using such techniques. In the generation of the hierarchical interconnection description, the method of the present invention first receives a description of an integrated circuit design. The description of the integrated circuit design includes a plurality of functional modules in a desired hierarchy among the plurality of functional modules. In a simple application, a designer would create a desired hierarchy for the structure of a particular portion of an integrated circuit or a complete integrated circuit. Next, the method includes generating at least one interconnection structure capable of describing interconnections within the integrated circuit design for a plurality of hierarchical levels of integrated circuit design. Preferably, the plurality of hierarchical levels represents the desired hierarchy received.

For each interconnection structure, the method inserts respective interconnection data describing interconnections of respective modules to create completed interconnection structures. Finally the method includes extracting the hierarchical interconnection description of the integrated circuit design from the completed interconnection structures and outputting the description. Once this step is complete, the method has essentially completed the design of the integrated circuit wherein a particular functionality contemplated by the designer and implemented in the desired hierarchy has been accomplished. The method of the present invention correctly interconnects each of the functional modules required to accomplish the operation of the integrated circuit design. In this fashion, manual steps and related errors introduced in interconnecting functional modules has been alleviated. The present invention also includes methods for extracting information from existing designs that will enable a designer to segregate particular integrated designs into smaller portions. The present invention further includes instructions for accomplishing such goals and for manufacturing integrated circuitry.

Figure 1:
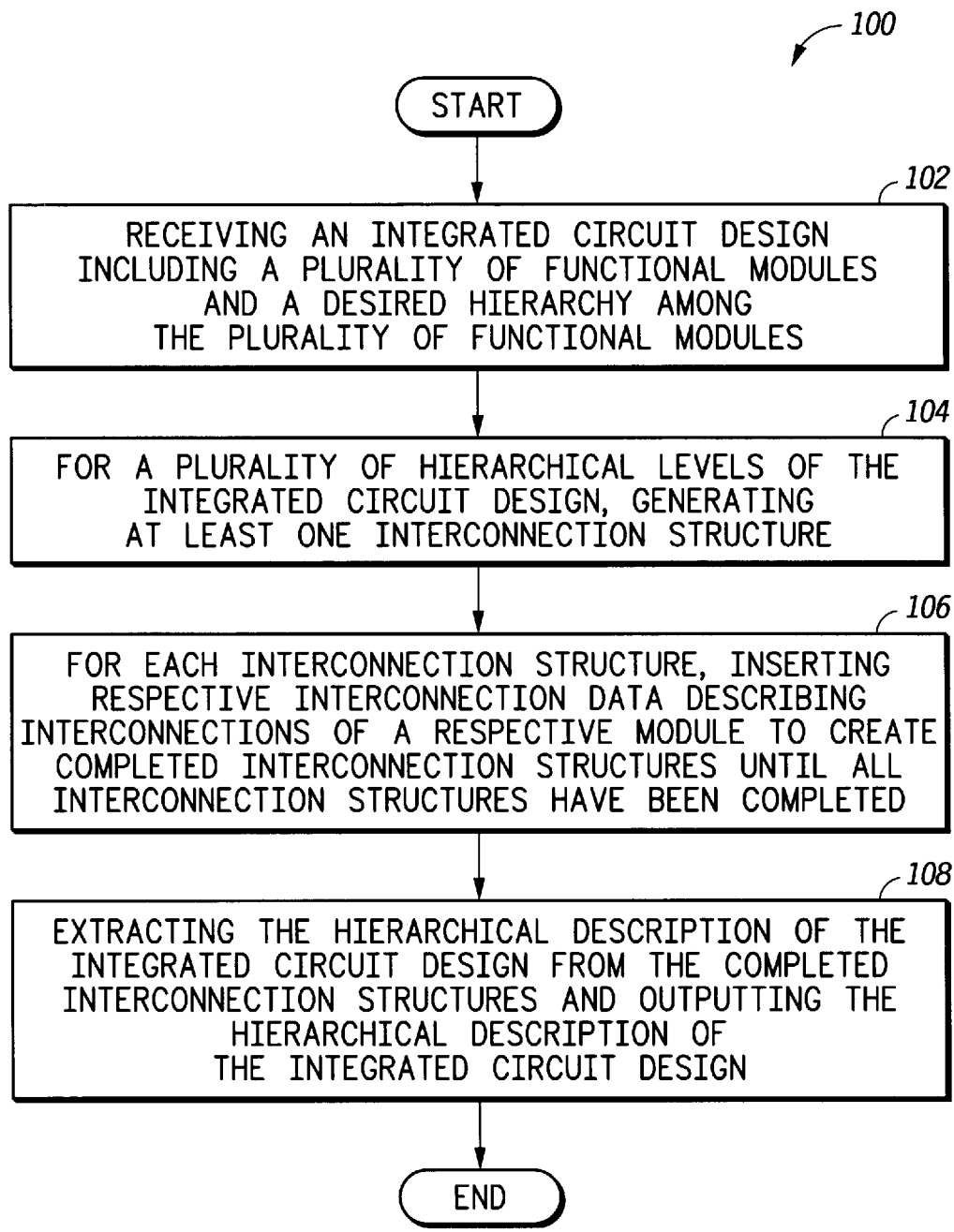
FIG. 1 is a logic diagram illustrating a method for creating a hierarchical interconnection description of an integrated circuit design in accordance with the present invention.

FIG. 1 illustrates a method 100 for creating a hierarchical interconnection description for at least a portion of an integrated circuit design. The method 100 commences at step 102 of receiving an integrated circuit design including a plurality of functional modules and a desired hierarchy among the plurality of functional modules. In a typical implementation of the method of the present invention, leaf modules such as those used in the VERILOG™ program sold by Cadence Design Systems, Inc. of San Jose, Calif. represent the functional modules within the integrated circuit design. The desired hierarchy includes a top level to bottom level description of a defined hierarchy of the integrated circuit design. For example, in a typical integrated circuit design that would include millions of transistors, the integrated circuit design could include fifteen levels of hierarchy. Thus, if such a design was used in accordance with the method of the present invention, the desired hierarchy would include a top level through a bottom level wherein the bottom level is fourteen levels below the top level. Each of the levels in the desired hierarchy represents some functional distinction within the integrated circuit design.

Next, at step 104 the method includes generating at least one interconnection structure for a plurality of hierarchical levels of the integrated circuit design. Each of the interconnection structures is capable of describing interconnections within the integrated circuit design. In the situation where there are fifteen hierarchical levels, each level connects to at least one other level. At the highest level, the interconnection structure represents or includes input and output signals as well as signals that are transmitted to and received from lower hierarchical levels within the integrated circuit design. The method of the present invention optionally creates a functional module that has as its connections to lower hierarchical levels the inputs and outputs of the integrated circuit. In this fashion, the hierarchy may be more easily generated through logical operations.

From step 104 the method proceeds to step 106 wherein, for each interconnection structure, respective interconnection data is inserted into the interconnection structures that describes interconnections of a respective module. Step 106 therefore generates relevant interconnection data and fills interconnection structures that were generated in step 104 with relevant interconnection data. Thus, at the completion of step 106, the integrated circuit has been effectively interconnected so that the plurality of functional modules within the integrated circuit design in combination accomplish the overall operation of the integrated circuit design.

Finally, at step 108, the method includes extracting the hierarchical interconnection description of the integrated circuit design from the completed interconnection structures and outputting the hierarchical interconnection description of the integrated circuit design. A typical output will include references to each of the plurality of functional modules, information describing the interconnections between the functional modules and the outputs of the integrated circuit design, and also a representation of the plurality of hierarchical levels of the integrated circuit design. Preferably, output is generated in a standard format, such as a VERILOG format, so that the output may be used in the manufacture of an integrated circuit.

The completed hierarchical interconnection description therefore provides a complete description of the integrated circuit design. Thus, the information produced may be used to create successively lower functional level descriptions of the integrated circuit design until a physical design file is created, mask sets are generated, and the integrated circuit is manufactured.

The method 100 of the present invention illustrated in FIG. 1 is preferably employed at the highest functional level of the integrated circuit design. In a typical implementation, the highest functional level is referred to as the behavioral level. However, the method 100 of FIG. 1 could be employed at other functional levels as well including the register transfer level, the resister/transistor level, and the component level. At each of these levels, the interconnection structure could be created and modified such that it would include all of the relevant connections within the integrated circuit design.

By creating the hierarchy in accordance with method of FIG. 1, references to functional modules and interconnections within the integrated circuit design may be easily modified. Such is the case because the method of the present invention uniquely identifies each particular interconnection within the integrated circuit design. Unlike prior art techniques performed by hand or through a combination of hand assembled files, the method of the present invention guarantees that no duplicate reference names will be employed. Thus, if any particular reference within a completed hierarchical interconnection description or other design created from such description is altered, the alteration may be performed without creating errors due to misnaming conventions. Further, references to particular modules within the integrated circuit design are selectively altered in accordance with the method of the present invention to prevent conflicts in names of the functional modules. Functional modules are uniquely identified in accordance with the present invention so that they may be selectively altered. Such conflict alleviation allows for easier changes to be made within an integrated circuit design than with prior art techniques.

Figure 2:
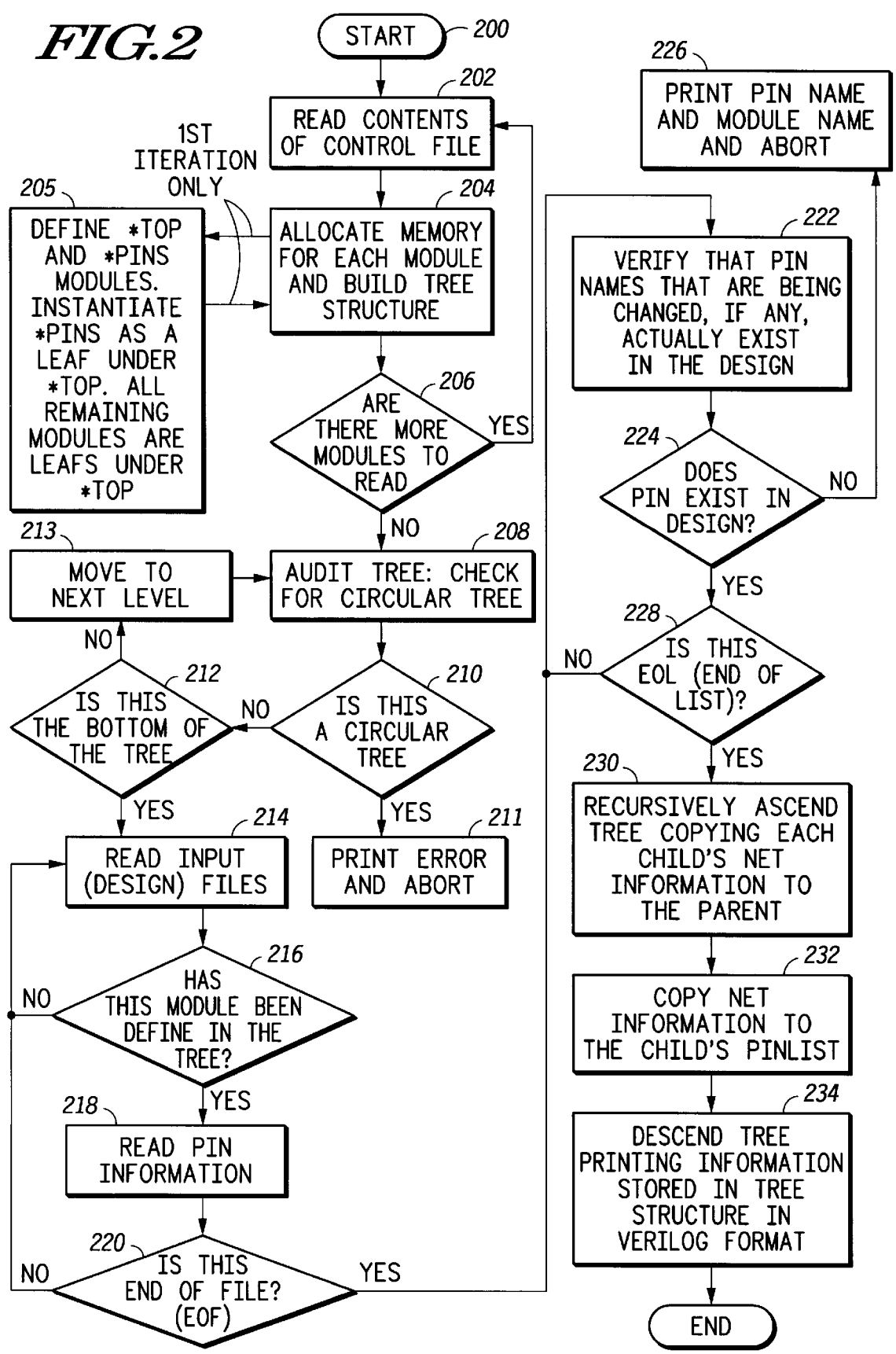
FIG. 2 is a logic diagram of an alternative embodiment of the method of the present invention.

FIG. 2 illustrates an alternative embodiment of the method of the present invention. Preferably, the method 200 of FIG. 2 is implemented on a digital computer designed to execute instructions and store data in memory and also to receive data from memory. Various types of digital computers and programming languages could be used to accomplish the goals of the present invention.

The method 200 of FIG. 2 commences at step 202 wherein the contents of a control file are read. Example 1 illustrates a control file that may be read at step 202 in accordance with the method of 200 of FIG. 2. Example 1 represents a simplified control file representative of a very small integrated circuit design having three hierarchical levels. Hierarchical module A is at the top level, hierarchical modules B and C as well as leaf module L3 are at the next lower level, and leaf modules L1, L2, and L4 are at the lowest hierarchical level

EXAMPLE 1

```
//****** The control file ******
PINS = clk
        ack
        tena
    rena
            reset;
A:  B L3 C;
B:  L1 L2;
```

-continued

```
C:  L4/inst0
    L4/inst1(.tena(reset));
L1;
L2;
L3;
L4;
```

A first component of the control file is labeled PINS. PINS represents external pins of the integrated circuit design that receive and transmit signals provided from and to the integrated circuit. All remaining signals are fully internal to the integrated circuit. The present invention includes indexing techniques for identifying the types of PINS represented. For example, some pins may be used strictly as inputs, some as outputs, and some in a bi-directional fashion.

A desired hierarchy for the integrated circuit design is next represented. Hierarchical level A represents the highest functional level associated with the integrated circuit design. Immediately below hierarchical level A are hierarchical levels B and C. However, as shown in Example 1, functional module L3 also resides immediately below hierarchical level A. Thus, functional module L3 includes connections to hierarchical level A. Hierarchical Level B is immediately below hierarchical level A. Below hierarchical level B are two functional modules L1 and L2. Hierarchical level C is immediately below hierarchical level A and contains two functional modules both of which are named L4.

Two functional modules, each of which are type L4, are distinguished as instance 0 and instance 1. Instance 1 of functional module L4 includes renaming one of the pins of the first instance of functional module L4 from tena to reset. By renaming the pin, name usage conflicts are avoided.

Finally, the control file includes references to the functional modules used within the desired hierarchy of the integrated circuit design. These functional modules include L1, L2, L3, and L4. Thus, the control file represents an integrated circuit design in a hierarchical format from its highest hierarchical level to its lowest hierarchical level but does not provide an interconnection description of the integrated circuit design. The control file also describes signals that provide input and output to the integrated circuit.

The desired hierarchy is typically generated automatically using various design tools. A complex integrated circuit design may include fifteen or more hierarchical levels. Such a design has a highest hierarchical level fourteen levels above a lowest hierarchical level. A design having fifteen hierarchical levels includes hierarchical modules at levels two through fifteen, includes functional modules at level one, and may include functional modules at levels two through fifteen as well. Hierarchical level fifteen has connections to lower level modules (hierarchical or function) and connections external to the integrated circuit design. Hierarchical levels one through fourteen have connections to adjacent levels The highest hierarchical level generally serves to interconnect hierarchical blocks, each of which represents large segments of an integrated circuit design such as instruction units, pipeline units, memory management units, and other high level segments of an integrated circuit design. Typically, separate design groups construct respective operational blocks or units and the blocks are later interconnected. By identifying the signals shared by the hierarchical blocks and by organizing the hierarchical blocks into an overall hierarchy of the integrated circuit design, the hierarchical blocks may be easily combined to create the complete integrated circuit design.

From step 202, the method proceeds to step 204 wherein memory is allocated for each interconnection structure required. An interconnection structure preferably is formed for each hierarchical module and for each functional module within the integrated circuit design. Each interconnection structure provides a mechanism for identifying the signals required to pass through and each hierarchical module at the hierarchical level. For each hierarchical level, there will typically be more than one interconnection structure. Only at the top level of the hierarchy will there by a single hierarchical module.

In one embodiment of the present invention, at the first iteration of step 204, the method proceeds to step 205 that creates PINS and TOP modules and allocates memory for related interconnection structures. The PINS modules represents the input and output signals associated with the integrated circuit design while the TOP module represents the highest hierarchical level of the integrated circuit design. Since the TOP hierarchical module is at the top hierarchical level, all hierarchical modules, including the PINS module, and functional leaf modules reside hierarchically below the TOP module. While the creation of the TOP and PINS modules streamlines operation of the method 200, the modules have no physical equivalent in the integrated circuit design. The modules serve to facilitate the reuse of algorithms within the method of the present invention to complete the interconnection description.

From step 204 the method proceeds to step 206 wherein it is determined whether all the modules and hierarchical levels of the control file have been read from the control file in step 202. If they have not all been read, the method proceeds to step 202 where additional hierarchical modules or functional modules are read from the control file. However, if in step 206 it is determined that all hierarchical levels and functional modules have been read from the control file, the method proceeds to step 208.

Prior to the execution of step 208, a complete tree structure has been generated for the integrated circuit design based upon the desired hierarchy. The tree structure does not include the interconnection of particular signals between modules but does represent the logical relationship between hierarchical and functional modules for all hierarchical levels within the integrated circuit design. The input and output signals to the integrated circuit design are also represented. At this point, particular information relating to the functional modules has not been read and full connectivity has not been determined. The functional modules have been represented as part of the hierarchical tree structure created in steps 202 through 206.

At step 208, one level of the tree structure is audited in order to look for indications of a circular tree structure. In a circular tree structure, there is effectively a circular reference between different levels in the hierarchy and perhaps even between functional modules within the hierarchy. Such a condition, which may have been inadvertently introduced by a designer in creating the desired hierarchy in the control file, represents an error in the integrated circuit design.

From step 208 the method proceeds to step 210 where it is determined whether or not the tree structure for a particular hierarchical level is circular. If the tree structure is circular, the method proceeds to step 211 wherein an error signal is printed to the user and the method 200 is aborted. If there is no detection of a circular tree for the particular level of the hierarchical tree structure investigated at 208, the method proceeds from step 210 to step 212 where it is determined whether or not the method has proceeded to the bottom hierarchical level of the hierarchical tree. If the investigation has not proceeded to the bottom hierarchical level of the hierarchical tree, the method proceeds to step 213 wherein another level of the tree structure is considered and the method proceeds to step 208 another hierarchical level is investigated to detect a circular tree.

If at step 212 it is determined that the bottom level of the tree structure has been reached, the method proceeds to step 214 of reading input design files. These input design files represent particular behavioral descriptions of functional modules that may have been included as a functional module in the integrated circuit design. From step 214 the method proceeds to step 216 where it is determined whether the particular functional module has been defined in the tree. If the functional module has not been defined in the tree, the methods proceeds again to step 214 where another input design file was read for a different functional module. However, if at step 216 it is determined that the functional module has been defined in the tree, the method proceeds to step 218 wherein pin information is read for the particular functional module. The pin information read at step 218 is specific to the particular functional module under consideration and may include pin names, alternate pin names, signal directions, signal widths, and other information relating to the connectivity and operation of the functional modules.

EXAMPLE 2

```
//****** The input file ******
    module  L1(clk, ack, reset);
            output clk;
            input ack;
            input reset;
    endmodule
    module  L2(enable, ack);
            input enable;
            output ack;
    endmodule
    module  L3(clk, clk_ena);
            input clk;
            input clk_ena;
    endmodule
    module  L4(rena, tena);
            output rena;
            output tena;
    endmodule
```

Example 2 represents functional module input files that may be used with the method of the present invention. For example, module L1 has three external connections: clock, ack, and reset. Clock is an output signal of the module while ack and reset are input signals of the module. Module L2 includes an input signal enable and an output signal ack. Module L3 and Module L4 also have particular definitions for signals input and output to the respective functional modules. While these input files do not include operational descriptions of the functional modules, the input files do explicitly define inputs and outputs of the functional modules. These inputs and outputs will be subsequently used to generate the hierarchical interconnection structure for the integrated circuit design.

From step 218, the method proceeds to step 220 wherein it is determined whether the end of file of the input design files has been reached. If the end of file has not been reached, the method proceeds again to step 214 where another functional module is read from the input design files. However, if at step 220 it is determined that the end of the file has been reached the method proceeds to step 222.

At step 222, the method verifies that pin names to be changed in conjunction with name change directions received from the control file in Example 1 actually exist in the designs. For example, in Example 1, under hierarchical level C, functional module L4 instance 1 required that signal tena be renamed to reset. Thus, at step 222, the method investigates functional module L4 to determine that signal named tena actually exists.

From step 222 the method proceeds to decision step 224. At decision step 224, if the pin did not exist in the design, the method proceeds to step 226 wherein the user is notified of the particular pin name, the particular functional module and the location where it was used and then the method is aborted. However, if at step 224 it is determined that the pin does exist, the method proceeds to step 228 where it is determined whether or not the end of list has been reached for those instances wherein pin names are to be changed. If at step 228 it is determined that the end of the list for pin name changes has not been reached the method proceeds again to step 222. However, if at step 228 it is determined that the end of the list has been reached for pin name changes, the method proceed to step 230.

At step 230, the method 200 includes recursively ascending the hierarchical tree that has been created and copying each child's net information to the parent. Step 230 starts at the lower most hierarchical level of the tree that was previously created wherein only functional modules reside. These functional modules include pin names and other information that is used to complete the interconnection structures that were previously allocated. In step 230, a particular functional module and/or defined hierarchical level under consideration is referred to as the child. Each of these modules and levels will have associated with it certain pin information which represents the interconnects for the object. At step 230 a next higher hierarchical level is referred to as the parent. The parent therefore is simply the hierarchical module at the next higher level in the hierarchy connected to the child.

For example, with reference to Example 1, a lowest level in the hierarchy is represented at functional modules L1, L2 and the two instances of L4. In this particular example, step 230 commences at the top of the tree, descends down through hierarchical level A down to hierarchical level B, and then down to function module L1. Because functional module L1 represents a lowest level, the pin information and additional information provided by functional module L1 is provided to the parents of L1, namely block B in the tree. From hierarchy module B the method would proceed down to leaf module L2. Since leaf module L2 is at the bottom of the tree, information will be provided from leaf module L2 as the child to hierarchy module B in step 230. Step 230 is performed for each particular functional module and hierarchical module within the tree structure previously created. At the completion of step 230, the interconnection structures were created in step 204 are partially filled with connection data from respective child modules. Thus, information relating to signals entering the hierarchical modules from lower hierarchical levels is collected.

EXAMPLE 3

```
Module *PINS:   IsTop=0
    Pins:
    Nets:
clk(clk)
ack(ack)
tena(tena)
rena(rena)
reset(reset)
    CELLS:
************************
Module *TOP:    IsTop=0
    Pins:
    Nets:
clk              <A>     <dir=2>  <gflag=0>  <width=0>
clk              <*PINS>  <dir=0>  <gflag=0>
ack              <A>     <dir=1>  <gflag=0>  <width=0>
ack              <*PINS>  <dir=0>  <gflag=0>
tena             <A>     <dir=2>  <gflag=0>  <width=0>
tena             <*PINS>  <dir=0>  <gflag=0>
rena             <A>     <dir=2>  <gflag=0>  <width=0>
rena             <*PINS>  <dir=0>  <gflag=0>
reset            <A>     <dir=1>  <gflag=0>  <width=0>
reset            <*PINS>  <dir=0>  <gflag=0>
enable           <A>     <dir=1>  <gflag=0>  <width=0>
clk_ena          <A>     <dir=1>  <gflag=0>  <width=0>
    CELLS:
A/A
*PINS/*PINS
************************
Module A:       IsTop=1
    Pins:
    Nets:
clk              <B>     <dir=2>  <gflag=0>  <width=0>
clk              <L3>    <dir=1>  <gflag=0>  <width=0>
clk(clk)
ack              <B>     <dir=1>  <gflag=0>  <width=0>
ack(ack)
tena             <C>     <dir=2>  <gflag=0>  <width=0>
tena(tena)
rena             <C>     <dir=2>  <gflag=0>  <width=0>
rena(rena)
reset            <B>     <dir=1>  <gflag=0>  <width=0>
reset            <C>     <dir=2>  <gflag=1>  <width=0>
reset(reset)
enable           <B>     <dir=1>  <gflag=0>  <width=0>
clk_ena          <L3>    <dir=1>  <gflag=0>  <width=0>
    CELLS:
B/B
L3/L3
C/C
************************
Module B:       IsTop=0
    Pins:
    Nets:
clk              <L1>    <dir=2>  <gflag=0>  <width=0>
clk(clk)
ack              <L1>    <dir=1>  <gflag=0>  <width=0>
ack              <L2>    <dir=2>  <gflag=0>  <width=0>
ack(ack)
reset            <L1>    <dir=1>  <gflag=0>  <width=0>
reset(reset)
enable           <L2>    <dir=1>  <gflag=0>  <width=0>
    CELLS:
L1/L1
L2/L2
************************
Module C:       IsTop=0
    Pins:
    Nets:
tena             <L4>    <dir=2>  <gflag=0>  <width=0>
tena(tena)
rena             <L4>    <dir=2>  <gflag=0>  <width=0>
rena             <L4>    <dir=2>  <gflag=0>  <width=0>
rena(rena)
reset            <L4>    <dir=2>  <gflag=1>  <width=0>
reset            <L4>    <dir=2>  <gflag=1>  <width=0>
reset(reset)
    CELLS:
L4/inst0
L4/inst1
tena(reset)
************************
Module L1:      IsTop=0
    Pins:
clk(clk)
ack(ack)
reset(reset)
```

```
        Nets:
clk(clk)
ack(ack)
reset(reset)
        CELLS:
*************************
Module  L2:      IsTop=0
        Pins:
ack(ack)
enable(enable)
        Nets:
ack(ack)
enable(enable)
        CELLS:
*************************
Module  L3:      IsTop=0
        Pins:
clk(clk)
clk_ena(clk_ena)
        Nets:
clk(clk)
clk_ena(clk_ena)
        CELLS:
*************************
Module  L4:      IsTop=0
        Pins:
tena(tena)
rena(rena)
reset(reset)
        Nets:
tena(tena)
rena(rena)
reset(reset)
        CELLS:
```

Example 3 illustrates the partially filled interconnection structures after the execution of step 230 that has brought child information into the structures. Module TOP has two hierarchical modules connected to it, module A and module pins. Module TOP has nets (interconnections) clk, ack, tena, rena, reset, enable, and clk_ena from module A, one of its children. Module TOP also has nets clk, ack, tena, rena, and reset associated with Module pins. Example 3 also illustrates the nets associated with the other hierarchical modules and functional modules.

From step 230 the method proceeds to step 232 where the method includes recursively descending the hierarchical tree previously created and copying net information from parents to children's PINS lists for all hierarchical modules within the hierarchical interconnection description. Thus at the conclusion of step 232, the relevant net connection information that is brought from each parent to each relevant child's PINS list has been copied. Once step 232 has been completed, all relevant interconnection information including net connects and pin names amongst the functional modules and hierarchical modules within the interconnection structures has been determined. This information relates the interconnections required between functional, hierarchical modules, and inputs and outputs to the integrated circuit. This information therefore provides a complete interconnected description of the integrated circuit design.

Example 4 illustrates the interconnection structures after the execution of step 232 wherein parent information was been brought into respective child interconnection structures. As illustrated, after the completion of step 232 all Pin information has been completed. The Pin information relates the actual connections required to complete the hierarchical interconnection description of the integrated circuit.

EXAMPLE 4

```
******** Nets after build routine ********
Module  *PINS:   IsTop=0
        Pins:
clk(clk)
ack(ack)
tena(tena)
rena(rena)
reset(reset)
        Nets:
clk(clk)
ack(ack)
tena(tena)
rena(rena)
reset(reset)
        CELLS:
*************************
Module  *TOP:    IsTop=0
        Pins:
        Nets:
clk                 <A>       <dir=2>  <gflag=0>  <width=0>
clk                 <*PINS>   <dir=0>  <gflag=0>
ack                 <A>       <dir=1>  <gflag=0>  <width=0>
ack                 <*PINS>   <dir=0>  <gflag=0>
tena                <A>       <dir=2>  <gflag=0>  <width=0>
tena                <*PINS>   <dir=0>  <gflag=0>
rena                <A>       <dir=2>  <gflag=0>  <width=0>
rena                <*PINS>   <dir=0>  <gflag=0>
reset               <A>       <dir=1>  <gflag=0>  <width=0>
reset               <*PINS>   <dir=0>  <gflag=0>
enable         <A>      <dir=1>  <gflag=0>  <width=0>
clk_ena        <A>      <dir=1>  <gflag=0>  <width=0>
        CELLS:
A/A
*PINS/*PINS
*************************
Module  A:       IsTop=1
        Pins:
clk(clk)
ack(ack)
tena(tena)
rena(rena)
reset(reset)
        Nets:
clk                      <B>   <dir=2>   <gflag=0>   <width=0>
clk                      <L3>  <dir=1>   <gflag=0>   <width=0>
clk(clk)
ack                      <B>   <dir=1>   <gflag=0>   <width=0>
ack(ack)
tena                     <C>   <dir=2>   <gflag=0>   <width=0>
tena(tena)
rena                     <C>   <dir=2>   <gflag=0>   <width=0>
rena(rena)
reset                    <B>   <dir=1>   <gflag=0>   <width=0>
reset                    <C>   <dir=2>   <gflag=1>   <width=0>
reset(reset)
enable              <B>   <dir=1>         <gflag=0>   <width=0>
clk_ena             <L3>  <dir=1>         <gflag=0>   <width=0>
        CELLS:
B/B
L3/L3
C/C
*************************
Module  B:       IsTop=0
        Pins:
clk(clk)
ack(ack)
reset(reset)
        Nets:
clk                      <L1>  <dir=2>   <gflag=0>   <width=0>
clk(clk)
ack                      <L1>  <dir=1>   <gflag=0>   <width=0>
ack                      <L2>  <dir=2>   <gflag=0>   <width=0>
ack(ack)
reset                    <L1>  <dir=1>   <gflag=0>   <width=0>
reset(reset)
enable                   <L2>  <dir=1>   <gflag=0>   <width=0>
        CELLS:
L1/L1
```

-continued

```
L2/L2
************************
Module  C:       IsTop=0
       Pins:
tena(tena)
rena(rena)
reset(reset)
       Nets:
tena              <L4>  <dir=2>  <gflag=0>  <width=0>
tena(tena)
rena              <L4>  <dir=2>  <gflag=0>  <width=0>
rena              <L4>  <dir=2>  <gflag=0>  <width=0>
rena(rena)
reset             <L4>  <dir=2>  <gflag=1>  <width=0>
reset             <L4>  <dir=2>  <gflag=1>  <width=0>
reset(reset)
       CELLS:
L4/inst0
L4/inst1
tena(reset)
************************
Module  L1:       IsTop=0
       Pins:
clk(clk)
ack(ack)
reset(reset)
       Nets:
clk(clk)
ack(ack)
reset(reset)
       CELLS:
************************
Module  L2:       IsTop=0
       Pins:
ack(ack)
enable(enable)
       Nets:
ack(ack)
enable(enable)
       CELLS:
************************
Module  L3:       IsTop=0
       Pins:
clk(clk)
clk_ena(clk_ena)
       Nets:
clk(clk)
clk_ena(clk_ena)
       CELLS:
************************
Module  L4:       IsTop=0
       Pins:
tena(tena)
rena(rena)
reset(reset)
       Nets:
tena(tena)
rena(rena)
reset(reset)
       CELLS:
```

From step 232 the method proceeds to step 234 wherein the hierarchical tree is descended printing information stored in the tree structure in a behavioral level format, such as a VERILOG format. Upon printing the tree information while descending the tree, the actual hierarchical interconnection description of the integrated circuit design is completed.

Example 5 illustrates an output file corresponding to the integrated circuit design of Examples 1, 2, 3 and 4. Other output files for larger designs are larger with more hierarchical levels and functional modules.

EXAMPLE 5

```
module A(clk,ack,tena,rena,reset);
output clk;
inout ack;
output tena;
output rena;
output reset;
B B(.clk(clk),.ack(ack),.reset(reset));
L3 L3(.clk(clk),.clk_ena(clk_ena));
C C(.tena(tena),.rena(rena),.reset(reset));
endmodule
module B(clk,ack,reset);
output clk;
inout ack;
input reset;
L1 L1(.clk(clk),.ack(ack),.reset(reset));
L2 L2(.ack(ack),.enable(enable));
endmodule
module C(tena,rena,reset);
output tena;
output rena;
output reset;
L4 inst0(.tena(tena),.rena(rena));
L4 inst1(.tena(reset),.rena(rena));
endmodule
```

Referring to Example 5, module A is defined to have signals CLK, ACK, TENA, RENA, and RESET. Signal CLK, TENA, RENA in recent have been defined to be output signals while signal ACK is defined to be an in=out signal which means it is bi-directional. Further defined in the module A are the descriptions of the children of A, namely B, L3, and C. Defined within the children's description is the description of the signals that pass between the children of A and above A in the structure period. Since module A represents the highest level within the integrated circuit design in Example 5, those signals passing out of A will be input/output signals to the integrated circuit. Further included in Example 5 is a description of module B. The description of module B describes the input and output signals associated with the module as well as the functional modules which are children of module B. Module C is defined in an identical fashion based upon its signals and its children. Thus, the output file of the method 200 of FIG. 2 represents an actual integrated circuit design in a behavioral level format. This integrated circuit design has been fully completed by the method 200 of FIG. 2 to interconnect the modules both hierarchical modules and functional modules previously described in the control file such that the signals are correctly interconnected.

Thus, the method of FIG. 2 provides the important benefit of automating the interconnection of both hierarchical modules and functional modules within an integrated circuit design. In this fashion, an integrated circuit designer may merely describe the overall hierarchical structure of a desired design and describe those leaf or functional modules that will be used to accomplish the final tasks. The method 200 of FIG. 2 may be used to correctly and automatically interconnect each of the functional modules and the hierarchical modules contained within the integrated circuit design. Further, separate portions of designs may be more easily joined using the method 200 of FIG. 2. Thus, the benefits of the present invention are error elimination in the interconnection of modules within the integrated circuit design as well as significant cost savings through reduced personnel in designer effort as well as reduced overall design time due to the effort associated with accomplishing the goals now accomplished by the present invention.

Figure 3:
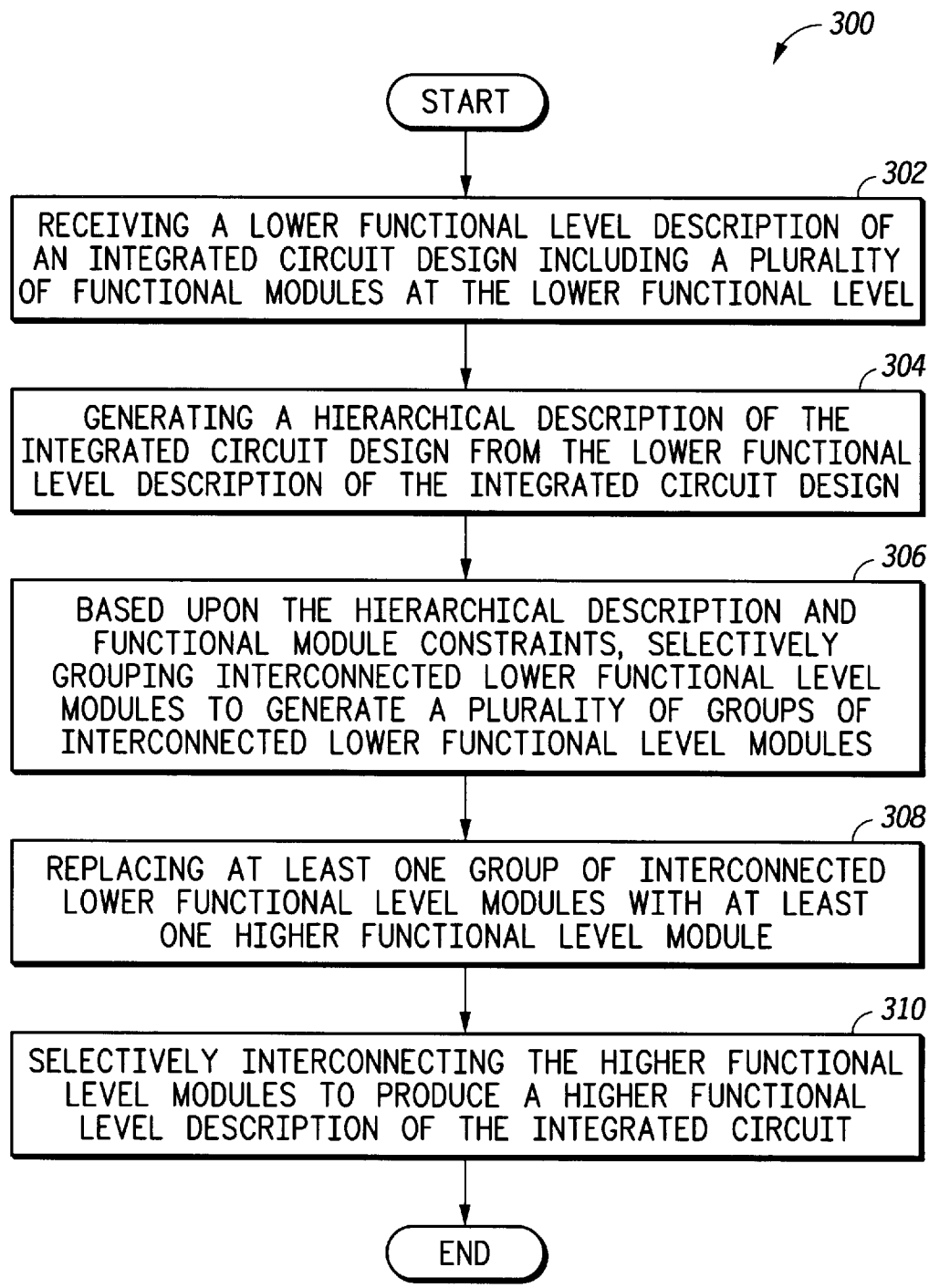
FIG. 3 is a logic diagram illustrating a method for generating a higher functional level description of an integrated circuit from a lower functional level description of the integrated circuit design.

FIG. 3 illustrates a method 300 for generating a higher functional level description of an integrated circuit design from a lower functional level description of the integrated circuit design. The method 300 commences at step 302 of receiving a lower functional level description of an integrated circuit design including a plurality of functional modules at the lower functional level. This lower functional level description of the integrated circuit design may also include additional connectivity information among the functional modules associated with the lower level design. The lower functional level design may be at a component level, an RTL level or any other lower level known in the art associated with a design of integrated circuitry.

From step 302 the method proceeds to step 304 of generating a hierarchical interconnection description of the integrated circuit design from a lower functional level description of the integrated circuit design. Preferably, step 304 is accomplished in conjunction with those steps previously described in accordance with FIGS. 1 and 2. However, the hierarchical interconnection description associated with step 304 could be performed in accordance with any other technology or methodology for generating a hierarchical interconnection description. Once this hierarchical interconnection description has been completed in step 304, an overview of the integrated circuit design will be provided.

Next, from step 304 the method 300 proceeds to step 306 of selectively grouping lower level functional modules using the hierarchical interconnection description. The selective grouping is preferably performed in accordance with logical rules for creating higher level functional modules based upon the functionality and operation of the lower level functional modules. For example, a plurality of gate level elements such as inverters, T-gates, NAND gates and NOR gates may be collectively grouped to form a latch. Another example of grouping functional level modules at a lower functional level would be to group modules at the register transfer level into groups, which as a group, perform functions equivalent to functional modules at a higher functional level. In this fashion, lower functional level modules could be grouped into functional equivalents such as sequential logic units, clock circuits, and various other functional modules that may be described.

Step 306 requires that interconnectivity among the plurality of functional modules at the lower functional level be known. Without the interconnectivity information, the functional modules at the lower functional level could not be grouped together to produce the higher functional level modules. This interconnectivity information is obtained from the hierarchical interconnection description generated in step 304.

Next, at step 308, the method 300 includes replacing at least one group of interconnected lower functional level modules with at least one higher functional level module. Thus, step 308 attempts to take a step upward on the functional level to cause a grouping of operations within of the integrated circuit, previously accomplished by a plurality of lower functional level modules, into a single higher functional level module. In this fashion, the integrated circuit design may be transformed from a lower functional level model, such as a register transfer level model, to a higher functional level model, such as a behavioral level model wherein the design may be more easily altered and reused.

From step 308, the method 300 proceeds to step 310 of selectively interconnecting the higher functional level modules to produce a higher functional level description of the integrated circuit. Step 310 is preferably accomplished again based upon the hierarchical interconnection description of the integrated circuit design that was created in 304. Because the framework of the integrated circuit design had been derived in step 304, once the functional level modules have been grouped into higher functional level modules, the selective interconnection of the higher functional level modules may be accomplished efficiently in step 310.

Thus, the method 300 of FIG. 3 accomplishes the important objective of recasting an integrated circuit design previously at a lower functional level at a higher functional level. Thus, designs that have been tested through their manufacture and use may be reused through converting the designs to a higher functional level, adding, taking from, or selectively redesigning portions of the integrated circuit to create a new integrated circuit design.

The method 300 streamlines the reuse of integrated circuit designs to reduce the time, manpower, and cost required to create a new integrated circuit design. The various functional level descriptions that may be implemented in accordance with method 300 of FIG. 3 would include register transfer level descriptions, gate level descriptions, behavioral level descriptions, component level descriptions, and resister transistor level descriptions. The method 300 of FIG. 3 may be employed to transition from any of the various functional levels to a higher level functional level description. Thus, the method 300 of FIG. 3 is not limited to a particular implementation or functional level description of the integrated circuit.

Figure 4:
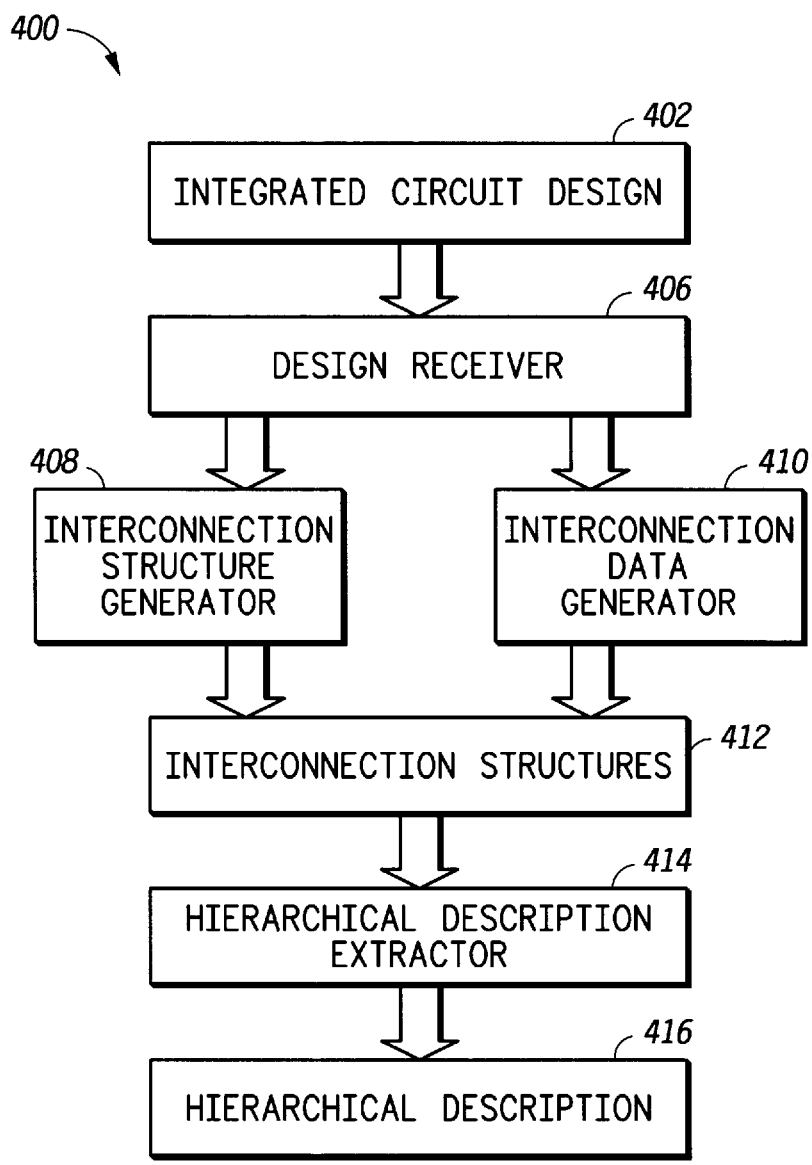
FIG. 4 is a block diagram illustrating an apparatus for creating a hierarchical interconnection description of an integrated circuit design.

FIG. 4 illustrates an apparatus for creating a hierarchical interconnection description for at least a portion of integrated circuit design. The apparatus 400 includes a design receiver 406, interconnection structure generator 408, interconnection data generator, and hierarchical interconnection description extractor.

The design receiver 406 receives a description of the integrated circuit design 402 that includes a plurality of functional modules and a desired hierarchy among the plurality of functional modules. Design receiver 406 preferably provides the design to both the interconnection structure generator 408 and the interconnection data generator 410. The interconnection structure generator 408 generates at least one interconnection structure for each plurality of hierarchical levels of the integrated circuit design. Each interconnection structure is capable of describing interconnections within the integrated circuit design. These interconnections, as were previously described, may include interconnections between functional modules and/or interconnections between hierarchical modules and functional modules.

The interconnection data generator 410 generates the interconnection data and inserts interconnection data into the interconnection structure 412 to create completed interconnection structures. The completed interconnection structures represent the interconnections between the various function modules and the hierarchical modules created and defined previously.

The hierarchical interconnection description extractor 414 extracts the hierarchical interconnection description of the integrated circuit design from the completed interconnection structures 412. The hierarchical interconnection description extractor 414 then outputs the hierarchical interconnection description of the integrated circuit design 416.

Thus, the Apparatus 400 of FIG. 4 creates a hierarchical interconnection description for at least a portion of the integrated circuit design based upon high level designer input. By automatically creating the hierarchical interconnection description, errors are reduced, instances of reuse of functional modules are uniquely identified by renaming pins and signals, and finally, interconnections are uniquely identified to avoid errors caused by incorrect connections. These errors are all reduced prior to manufacture of an integrated circuit based upon the hierarchical interconnection description. Thus, the integrated circuit design based upon the description will have a reduced number of errors.

Figure 5:
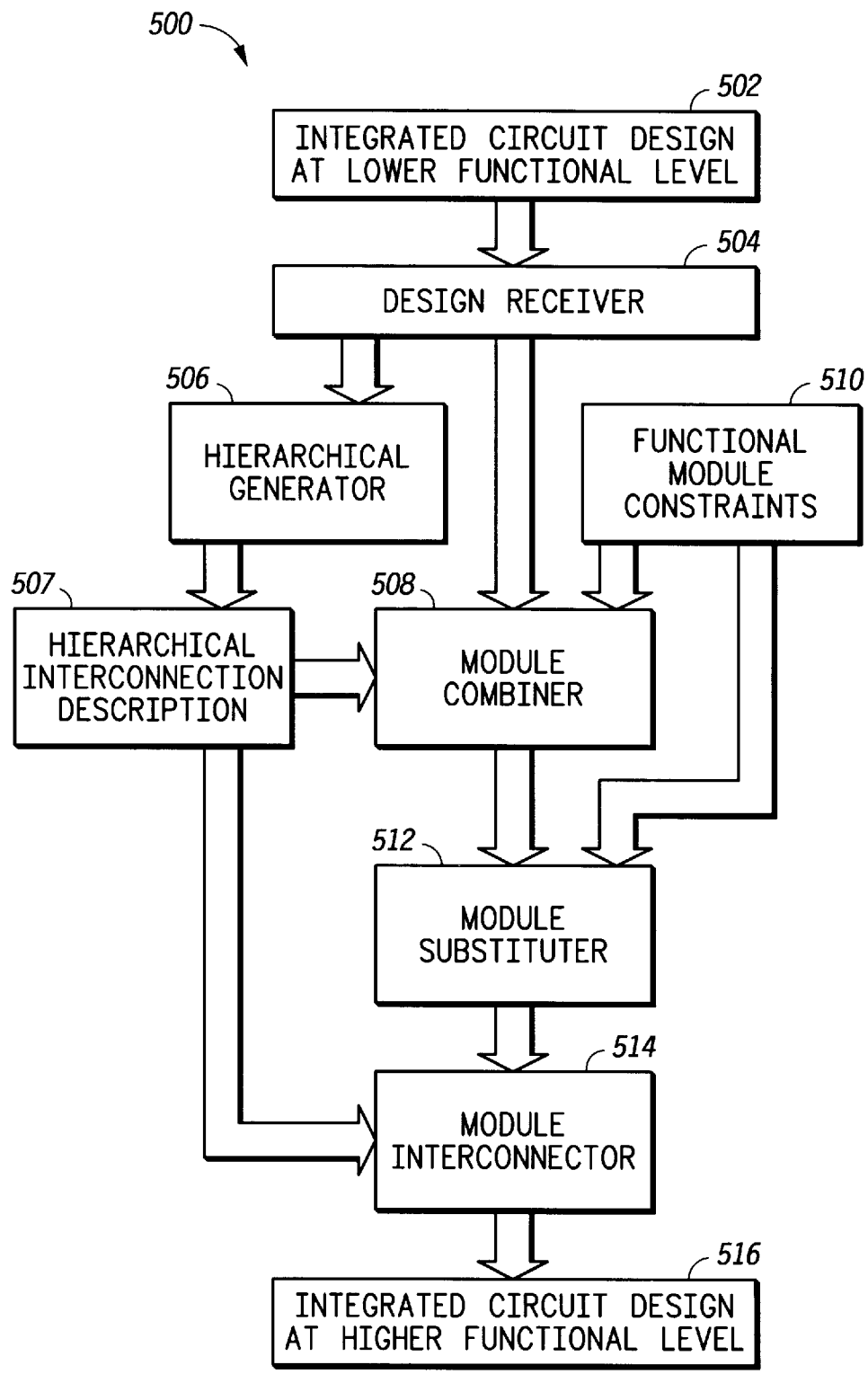
FIG. 5 is a block diagram illustrating an apparatus for generating a higher functional level description of an integrated circuit design from a lower functional level description of the integrated circuit design.

FIG. 5 illustrates an apparatus 500 for generating a higher functional level description of an integrated circuit design from a lower functional level description of the integrated circuit design. The Apparatus 500 comprises a design receiver 504, hierarchy generator 506, module combiner 508, module substituter 512, and module interconnector 514.

The design receiver 504 receives a lower functional level description of an integrated circuit design 502. The lower functional level description of the integrated circuit design includes a plurality of functional modules at the lower functional level as well as a plurality of interconnections among the lower functional level modules. The hierarchy generator 506 generates a hierarchical interconnection description 507 of the integrated circuit design from a lower functional level description of the integrated circuit design. In one embodiment, the hierarchy generator 506 generates this hierarchy in accordance with the method of the present invention previously described. However, different techniques and apparatus may be used to generate the hierarchy in accordance with element 506.

Module combiner 508 selectively groups interconnected lower functional level modules based upon the hierarchical interconnection description and functional module constraints 510 to generate a plurality of groups of interconnected lower functional level modules. As has been previously described, lower functional level modules in combination perform higher functional level operations. Based upon the various constraints on the lower functional level modules and the higher functional level modules receive as the functional module constraints 510, the module combiner 508 may selectively combine the lower functional level modules to implement the functions of the higher functional level modules.

The module interconnecter 514 selectively interconnects the higher functional level modules to produce a higher functional level description of the integrated circuit design 516. The module interconnecter preferably employs the hierarchical interconnection description 507 of the integrated circuit design in interconnecting the higher functional level modules produced by the module substituter 512. In this fashion, a complete higher functional level description of the integrated circuit may be produced for further use.

Thus, the Apparatus 500 of FIG. 5 provides the important benefits of automatically translating integrated circuit designs from a lower functional level to a higher functional level. Such transition is useful in redesigns, alterations, and various other designs performed using an existing design at a lower level. Thus, the Apparatus 500 FIG. 5 produces the important benefits of reduction in costs associated with the design of integrated circuitry as well as reduction in time required to create new integrated circuit designs.

Figures 6, 8:
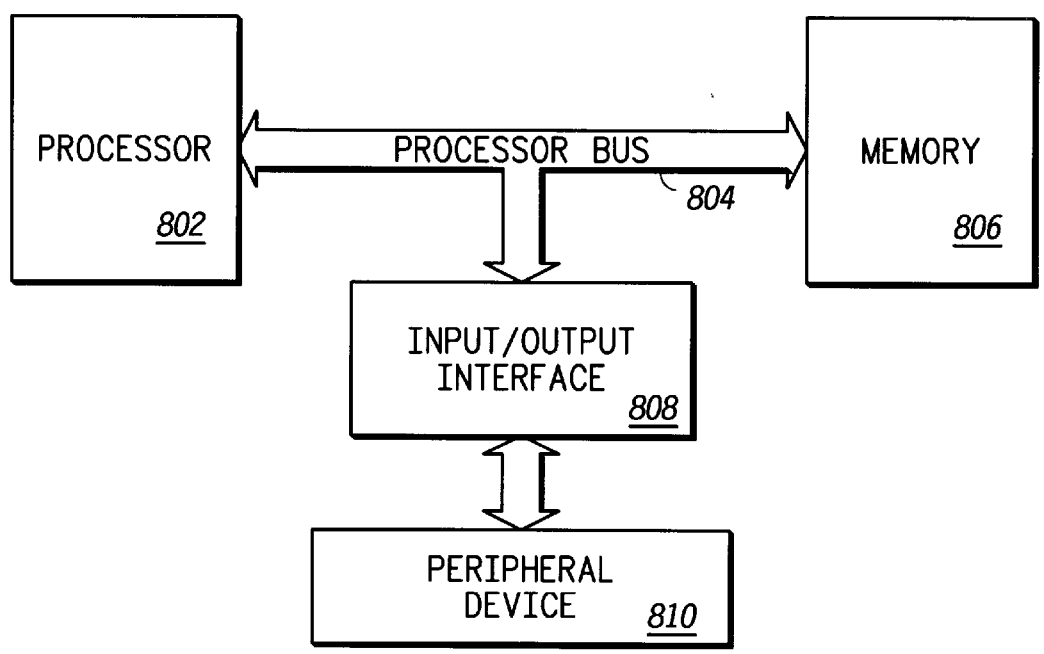
FIG. 6 is a diagram illustrating a cross reference table between modules in a hierarchical interconnection description generated in accordance with present invention.
FIG. 8 is a block diagram illustrating a data processing system in accordance with the present inventions.

FIG. 6 illustrates a cross reference structure 600 created in accordance with the methods and apparatus of the present invention. As illustrated, the cross reference structure 600 includes a plurality of signals or pins in a left-hand column. Along a top column are both hierarchical modules and functional modules associated with Examples 1 through 5 previously discussed. For each of the signals, the cross reference structure indicates whether a particular signal is associated with each of the modules within the integrated circuit design. For example, Signal CLK is an output signal for modules A, B and L1. Signal CLK passes from functional module L1 to hierarchical module B and then to hierarchical module A and passes out from hierarchical level A as an input/output of the integrated circuit. The other signals associated with the integrated circuit are also referenced within the cross reference structure 600 illustrated in FIG. 6.

Thus, the cross reference structure 600 of FIG. 6 provides a graphical description of the flow of signals within the integrated circuit design. In this fashion, the designer may view the signals and may determine an efficient manner within which to organize functional levels in an actual implementation of the integrated circuit and how to route signals among the functional modules of the integrated circuit. Alternatively, the integrated circuit designer could optimize the integrated circuit design by determining how to more efficiently create a desired hierarchy for use with the method of the present invention.

Figure 7:
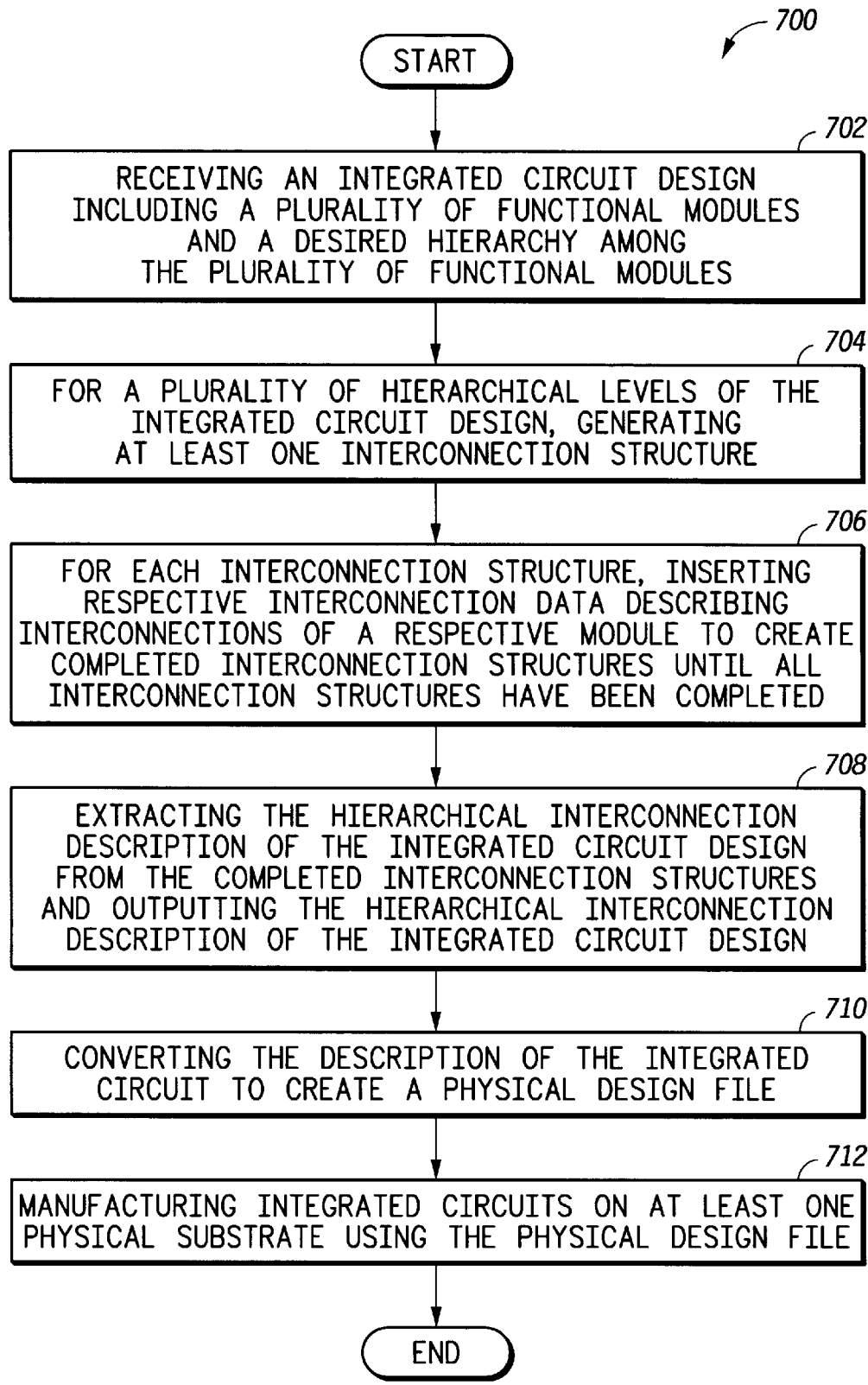
FIG. 7 is a logic diagram illustrating a method for manufacturing integrated circuits in accordance with the principles of the present inventions.

FIG. 7 Illustrates a method 700 for making an integrated circuits in accordance to the present invention. The method 700 commences at step 702 of receiving a description of an integrated circuit design including a plurality of functional modules and a desired hierarchy among the plurality of functional modules. Step 704 includes generating at least one interconnection structure capable of describing interconnections with the integrated circuit design. Such interconnection structures will be created for a plurality of hierarchical levels of the integrated circuits design.

From step 704 the method proceeds to step 706 of, for each interconnection structure, inserting respected interconnection data into the interconnection structures. The interconnection data describes interconnections of a respected module. Interconnection data inserted into each interconnection structure until all modules within the integrated circuit design had been completed.

Next at step 708, the method 700 includes extracting the hierarchical interconnection description of the integrated circuit design from the completed interconnection structures and outputting the hierarchical the description in the integrated circuit design. Next, at step 710 the method includes converting the description of the integrated circuit design to create a physical design file. The physical design file includes integrated circuit dimensions, element locations, and element dimensions of elements within the integrated circuit. The physical design file locates these elements in connection within a two dimensional substrate area of a circuit die.

Finally, at 712 the method 700 includes manufacturing the integrated circuit die onto at least one physical substrate design file. The formation and manufacture of integrated circuits upon physical substrates is known in the art and is described in many publicly available references.

Thus, the method 700 of FIG. 7 illustrates a technique for manufacturing integrated circuitry employing the teachings of the present invention. In this fashion, the manufacturing process may be streamlined by reducing design cycle time and design cost. Because the method 700 of FIG. 7 produces design having fewer errors, reductions in manufacturing cost will also result. Thus, the method 700 includes both reductions in cost and time in the design of the integrated circuit as well as the actual manufacturing cycle of the integrated circuit.

The method of the present invention also includes manufacturing integrated circuitry based upon redesign and reuse of an existing design. In accordance with the method, a lower functional level description, preferably that has been debugged in the manufacturing process, is reused. The lower functional level description of the integrated circuit is first converted to a higher functional level description through generation of a hierarchy and the conversion of lower functional level modules to higher functional level modules. The steps associated with such conversion have previously described with reference to FIG. 3. Once the higher functional level description of the integrated circuit has been created, it is modified by reducing or adding to it to create a modified integrated circuit design. Once the design has been modified to produce the new design at the higher functional level, the integrated circuit design is processed to create a physical design file. The physical design file is then used to manufacture the integrated circuit. Thus, the method described facilitates reuse of designs to create new designs therefore reducing overall design costs. Further, because designs have been previously debugged that are used in accordance with the method, the method will also reduce manufacturing costs through reduction of errors.

FIG. 8 illustrates a data processing system 800 in accordance to the present invention. The data processing system 800 is for creating a hierarchical interconnection description for at least a portion of integrated circuit design. The data processing system 800 comprised the processor 802, processor bus 804, memory 806, and input/output interface 808. The apparatus 800 preferably also includes a peripheral device 810 that will facilitate the communication between data processing system and a user. Preferably, the components associated with the data processing 800 are of types known in the art that may be employed to execute digital instructions in the form of computer program. At least one embodiment of the present invention comprises a computer program implemented at least partially in a digital computer program that is run on the data processing system 800 illustrated in FIG. 8.

The processor 802 is preferably of type that may process instructions and data to produce output. Preferably the data and instructions may be passed across processor bus 804 between processor 802, memory 806, and input/output interface 808. Thus the processor bus 804 must have sufficient band width and data transfer capability to accomplish the data processing requirements associated with the math of the present invention.

The memory 806 preferably may store instructions as well as data that may be processed by the processor 802 and transferred across the processor bus 804. The memory 806 the present invention preferably may store instructions when instructions accomplish the particular method steps of the present inventions. Thus, the method steps associated with FIGS. 1, 2, & 3 are storable in the memory 806 and executable by the processor 802 of the data processing system 800 of FIG. 8.

Thus, data processing system 800 of FIG. 8 maybe employed to accomplish the goals of present invention. Since substantially all the design work of integrated circuits is accomplished on digital computers, data processing system 800 of FIG. 8 may operate upon particular integrated circuit design to create hierarchies within the data processing system.

Present invention also includes computer readable storage devices adapted for use with a digital computer. Computer readable storage devices may be read by a digital computer peripheral such as a floppy diskette drive, an optical drive, hard disc drive, a compact disc (CD), a serial interface, parallel interface, magnetic tape, RAM, ROM, EEPROM, EPROM, flash memory, nonvolatile memory, or any other type of interface that will transfer information between computers.

The computer readable storage device includes a plurality of storage locations each of which is readable by a computer system via a peripheral storage reading device. In each of the plurality of storage locations are stored sets of instructions. Each of the sets of instructions will preferable execute method steps of the present invention. Thus, the method steps are individually stored in each of the plurality of storage locations in a manner consistent with the method step previously described. However, the steps may be stored in varying ways on the computer readable medium. In any case however, the instructions are readable by a digital computer to cause a digital computer to execute the particular functions. Thus, the computer readable storage device of the present invention may be employed to transfer the teachings of the present invention from one digital computer to another digital computer.

The above described embodiments are intended to illustrate the principles of the invention, but not to limit the scope of the invention. Various other embodiments and modifications to these embodiments may be made by those skilled in the art without departing from the scope of the following claims.

What is claimed is:

1. A method for creating a hierarchical interconnection description for an integrated circuit design, the method comprising the steps of:

(a) receiving a description of the integrated circuit design, wherein the description includes a designation of a plurality of inputs and outputs for a plurality of functional modules that are currently disconnected and a desired interconnection hierarchy among the plurality of functional modules;

(b) for a plurality of hierarchical levels of the integrated circuit design, generating at least one interconnection structure capable of describing interconnections between a set of the plurality of inputs and outputs within the integrated circuit design;

(c) for each interconnection structure in the at least one interconnect structure, transferring respective interconnection data describing interconnections of a respective module to another module coupled to the respective module to create completed interconnection structures until all interconnection structures between modules have been completed; and (d) extracting the hierarchical interconnection description of the integrated circuit design from the completed interconnection structures and outputting the hierarchical interconnection description of the integrated circuit design, the hierarchical interconnection description ensuring proper interconnection of inputs and outputs even when two objects within the integrated circuit design share a same reference label.

2. The method of claim 1, further comprising the step of:
   based at least partially upon the hierarchical interconnection description of the integrated circuit design, creating a higher functional level description of the integrated circuit design comprising a plurality of higher functional level modules, wherein the higher functional level description of the integrated circuit design includes interconnections among the higher functional level modules.

3. The method of claim 1, further comprising the step of:
based at least partially upon the hierarchical interconnection description of the integrated circuit design, creating a cross-reference structure, wherein the cross-reference structure graphically represents relationships between signal connections and directions and a plurality of functional modules within the integrated circuit design.

4. The method of claim 1, wherein step (b) creates interconnection structures for successively lower hierarchical levels of the integrated circuit design until interconnection structures have been created for a lowest hierarchical level of the integrated circuit design.

5. The method of claim 1, wherein step (c) includes inserting respective interconnection data describing interconnections of a respective module successively from a lowest hierarchical level of the integrated circuit design to a highest hierarchical level of the integrated circuit design.

6. The method of claim 1, further comprising the step of:
altering references to functional modules within the integrated circuit design to prevent functional module reference conflicts.

7. The method of claim 1, further comprising the step of:
altering references to interconnections within the integrated circuit design to prevent interconnection reference conflicts.

8. The method of claim 1, further comprising the step of:
processing the completed interconnection structures to detect circular error conditions in the integrated circuit design.

9. The method of claim 1, further comprising the step of:
generating a top level functional module, wherein the top level functional module represents the input/output of the integrated circuit design.

10. The method of claim 1, wherein step (b) further comprises generating a master node list, wherein the master node list includes a plurality of entries, and wherein each entry represents a module connection within the integrated circuit design.

11. The method of claim 10, wherein step (c) further comprises the steps of:
sorting the plurality of entries in the master node list to generate a sorted master node list; and
sequentially extracting a plurality of entries from the sorted master node list as the interconnection data.

12. The method of claim 1, further comprising the step of:
based at least partially upon the completed interconnection structures, detecting floating signals within the integrated circuit design.

13. The method of claim 1, wherein interconnection data is selected from the group consisting of at least pin names, alternate pin names, signal directions, signal widths, cell functional names, and cell instance names.

14. The method of claim 1, wherein the integrated circuit design is selected from the group consisting of behavioral level designs, register transfer level designs, net list level designs, standard cell level designs, transistor level designs, analog behavior designs, and analog component designs.

15. A method for generating a higher functional level description of an integrated circuit from a lower functional level description of an integrated circuit design, the method comprising the steps of:
(a) receiving the lower functional level description of the integrated circuit design, wherein the lower functional level description of the integrated circuit design includes a plurality of functional modules disconnected from one another and defined by the lower functional level description;
(b) generating a hierarchical interconnection description of the integrated circuit design from the lower functional level description of the integrated circuit design;
(c) based upon the hierarchical interconnection description and functional module constraints, selectively grouping interconnected lower functional level modules to generate a plurality of groups of interconnected lower functional level modules;
(d) replacing at least one group of interconnected lower functional level modules with at least one higher functional level module; and
(e) selectively interconnecting the at least one higher functional level module to produce a higher functional level description of the integrated circuit.

16. The method of claim 15, wherein in step (e), selectively interconnecting the at least one higher functional level module is based at least partially upon the hierarchical interconnection description of the integrated circuit design.

17. The method of claim 15, wherein step (b) further comprises the sub-steps of:
(i) for a plurality of hierarchical levels of the integrated circuit design, generating at least one interconnection structure capable of describing interconnections within the integrated circuit design;
(ii) for each interconnection structure in the at least one interconnection structure, inserting respective interconnection data describing interconnections of a respective module to create completed interconnection structures until all interconnection structures have been completed; and
(iii) extracting the hierarchical interconnection description of the integrated circuit design from the completed interconnection structures and outputting the hierarchical interconnection description of the integrated circuit design.

18. The method of claim 15, wherein the lower functional level description comprises a gate level description and the higher functional level description comprises a register transfer level description.

19. The method of claim 15, wherein the lower functional level description comprises a register transfer level description and the higher functional level description comprises a high level language description.

20. An apparatus for creating a hierarchical interconnection description for at least a portion of an integrated circuit design, the apparatus comprising:
(a) design receiver, wherein the design receiver receives a description of an integrated circuit design, wherein the description includes a plurality of functional modules and a plurality of inputs and outputs of each functional module which are to be interconnected among the plurality of functional modules;
(b) interconnection structure generator, wherein the interconnection structure generator generates at least one interconnection structure for each of a plurality of hierarchical levels of the integrated circuit design, wherein each interconnection structure is capable of describing interconnections within the integrated circuit design;
(c) interconnection data generator, wherein the interconnection data generator generates interconnection data and transfers the interconnection data into the interconnection structures and between functional modules to create completed interconnection structures; and (d) hierarchical interconnection description extractor, wherein the hierarchical interconnection description extractor extracts the hierarchical interconnection description of the integrated circuit design from the completed interconnection structures, and wherein the hierarchical interconnection description extractor outputs the hierarchical interconnection description of the integrated circuit design.

21. An apparatus for generating a higher functional level description of an integrated circuit from a lower functional level description of an integrated circuit design, the method comprising the steps of:

(a) design receiver, wherein the design receiver receives a lower functional level description of an integrated circuit design, wherein the lower functional level description of the integrated circuit design includes a plurality of functional modules at the lower functional level;

(b) hierarchy generator, wherein the hierarchy generator generates a hierarchical interconnection description of the integrated circuit design from the lower functional level description of the integrated circuit design;

(c) module combiner, wherein the module combiner selectively groups interconnected lower functional level modules based upon the hierarchical interconnection description and functional module constraints to generate a plurality of groups of interconnected lower functional level modules;

(d) module substituter, wherein the module substituter replaces at least one group of interconnected lower functional level modules with at least one higher functional level module; and (e) module interconnector, wherein the module interconnector selectively interconnects the at least one higher functional level modules to produce a higher functional level description of the integrated circuit.

22. A data processing system for creating a hierarchical interconnection description for at least a portion of an integrated circuit design, the data processing system comprising:

a processor, wherein the processor processes instructions;
a processor bus operably coupled to the processor;
an input/output interface operably coupled to the processor bus, wherein the processor controls a flow of data through the input/output interface;
memory operably coupled to the processor bus for storing data and instructions, wherein the memory stores instructions for:
receiving a description of an integrated circuit design, wherein the description includes a plurality of functional modules and a desired hierarchy among the plurality of functional modules;
for a plurality of hierarchical levels of the integrated circuit design, generating at least one interconnection structure capable of describing interconnections within the integrated circuit design in a hierarchical manner;
for each interconnection structure in the at least one interconnection structure, inserting respective interconnection data describing interconnections of a respective module to create completed interconnection structures until all interconnection structures have been completed whereby naming conflicts within the integrated circuit design have been corrected to result in proper interconnection of the modules; and extracting the hierarchical interconnection description of the integrated circuit design from the completed interconnection structures and outputting the hierarchical interconnection description of the integrated circuit design.

23. A data processing system for generating a higher functional level description of an integrated circuit from a lower functional level description of an integrated circuit design, the data processing system comprising:

a processor, wherein the processor processes instructions;
a processor bus operably coupled to the processor;
an input/output interface operably coupled to the processor bus, wherein the processor controls a flow of data through the input/output interface;
memory operably coupled to the processor bus for storing data and instructions, wherein the memory stores instructions for:
receiving a lower functional level description of an integrated circuit design, wherein the lower functional level description of the integrated circuit design includes a plurality of functional modules at the lower functional level;
generating a hierarchical interconnection description of the integrated circuit design from the lower functional level description of the integrated circuit design;
based upon the hierarchical interconnection description and functional module constraints, selectively grouping interconnected lower functional level modules to generate a plurality of groups of interconnected lower functional level modules;
replacing at least one group of interconnected lower functional level modules with at least one higher functional level module; and
selectively interconnecting the at least one higher functional level modules to produce a higher functional level description of the integrated circuit.

24. A computer readable storage device adapted for use with a digital computer such that the digital computer may read the computer readable storage device, wherein the computer readable storage device comprises:

(a) a first plurality of storage locations, wherein the first plurality of storage locations store instructions for causing the digital computer to receive a description of an integrated circuit design, wherein the description includes a plurality of functional modules which are disconnected from each other and a desired hierarchy among the plurality of functional modules;

(b) a second plurality of storage locations, wherein the second plurality of storage locations store instructions for causing the digital computer to generate at least one interconnection structure capable of describing interconnections within the integrated circuit design for a plurality of hierarchical levels of the integrated circuit design;

(c) a third plurality of storage locations, wherein the third plurality of storage locations store instructions for causing the digital computer to insert respective interconnection data describing interconnections of a respective module into each interconnection structure to create completed interconnection structures until all interconnection structures have been completed between all modules; and (d) a fourth plurality of storage locations, wherein the fourth plurality of storage locations store instructions for causing the digital computer to extract a hierarchical interconnection description of the integrated circuit design from the completed interconnection structures and output the hierarchical interconnection description of the integrated circuit design.

25. A computer readable storage device adapted for use with a digital computer such that the digital computer may read the computer readable storage device, wherein the computer readable storage device comprises:

(a) a first plurality of storage locations, wherein the first plurality of storage locations store instructions for causing the digital computer to receive a lower functional level description of an integrated circuit design, wherein the lower functional level description of the integrated circuit design includes a plurality of functional modules at the lower functional level;

(b) a second plurality of storage locations, wherein the second plurality of storage locations store instructions for causing the digital computer to generate a hierarchical interconnection description of the integrated circuit design from the lower functional level description of the integrated circuit design;

(c) a third plurality of storage locations, wherein the third plurality of storage locations store instructions for causing the digital computer to selectively group interconnected lower functional level modules to generate a plurality of groups of interconnected lower functional level modules based upon the hierarchical interconnection description and functional module constraints;

(d) a fourth plurality of storage locations, wherein the fourth plurality of storage locations store instructions for causing the digital computer to replace at least one group of interconnected lower functional level modules with at least one higher functional level module; and (e) a fifth plurality of storage locations, wherein the fifth plurality of storage locations store instructions for causing the digital computer to selectively interconnect the at least one higher functional level modules to produce a higher functional level description of an integrated circuit represented by the integrated circuit design.

26. A method for making an integrated circuit, the method comprising the steps of:

(a) receiving a description of an integrated circuit design, wherein the description includes a plurality of functional modules currently disconnected from each other and a desired hierarchy among the plurality of functional modules;

(b) for a plurality of hierarchical levels of the integrated circuit design, generating at least one interconnection structure capable of describing interconnections within the integrated circuit design;

(c) for each interconnection structure, inserting respective interconnection data describing interconnections of a respective module to create completed interconnection structures until all interconnection structures have been completed;

(d) extracting a hierarchical interconnection description of the integrated circuit design from the completed interconnection structures and outputting the hierarchical interconnection description of the integrated circuit design;

(e) converting the description of the integrated circuit design to create a physical design file, wherein the physical design file includes integrated circuit dimensions, element locations, and element dimensions of elements within the integrated circuit, wherein the physical design file locates elements and connections within a two-dimensional substrate area of an integrated circuit die; and (f) manufacturing the integrated circuit die onto at least one physical substrate in accordance with the physical design file.

27. A method for making an integrated circuit, the method comprising the steps of:

(a) receiving a lower functional level description of an integrated circuit design, wherein the lower functional level description of the integrated circuit design includes a plurality of functional modules at a lower functional level;

(b) generating a hierarchical interconnection description of the integrated circuit design from the lower functional level description of the integrated circuit design;

(c) based upon the hierarchical interconnection description and functional module constraints, selectively grouping interconnected lower functional level modules to generate a plurality of groups of interconnected lower functional level modules;

(d) replacing at least one group of interconnected lower functional level modules with at least one higher functional level module;

(e) selectively interconnecting the at least one higher functional level modules to produce a higher functional level description of the integrated circuit;

(f) converting the higher functional level description of the integrated circuit design to create a physical design file, wherein the physical design file includes integrated circuit dimensions, element locations, and element dimensions of elements within the integrated circuit, wherein the physical design file locates elements and connections within a two-dimensional substrate area of an integrated circuit die; and (g) manufacturing the integrated circuit die onto at least one physical substrate in accordance with the physical design file.

28. A method comprising the steps of:

providing an integrated circuit design file containing a plurality of modules which are intercoupled to each other and arranged in a hierarchical arrangement within the integrated circuit design;

representing each module as a node in a tree structure wherein the tree structure is representative of the hierarchical arrangement, the tree structure having parent nodes that represent parent modules that are higher in the hierarchical arrangement than child nodes which represent child modules that are located within the parent module;

extracting, for each module in the integrated circuit design, input and output information for each module and associating the input and output information for each module with a respective node in the tree structure; and recursively copying input and output information associated with each child node in the tree structure to the parent nodes of the respective child node to at least partially enable hierarchical interconnection of all of the modules in an error free manner.

29. The method of claim 28 further comprising the step of:

checking for erroneous circular paths within the tree structure before the step of recursively copying.

30. The method of claim 28 further comprising the step of:
changing the names of input and output signals in the input and output information to avoid naming conflicts.

31. The method of claim 28 further comprising the step of:
copying, after the step of recursively copying, information from input and output information associated with parent nodes to input and output information associated with child nodes to at least partially enable hierarchical interconnection of all of the modules in an error free manner.

32. The method of claim 28 further comprising the step of:
descending the tree structure to print out the input and output information after the step of recursively copying.

* * * * *